United States Patent
Jeong et al.

(10) Patent No.: US 11,385,515 B2
(45) Date of Patent: Jul. 12, 2022

(54) DISPLAY DEVICE

(71) Applicant: LG Display Co., Ltd., Seoul (KR)

(72) Inventors: Hoon Jeong, Gyeonggi-do (KR); Chulsang Shin, Gyeonggi-do (KR); Jin Her, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/102,208

(22) Filed: Nov. 23, 2020

(65) Prior Publication Data

US 2021/0173244 A1    Jun. 10, 2021

(30) Foreign Application Priority Data

Dec. 4, 2019    (KR) .................. 10-2019-0159571

(51) Int. Cl.
| | | |
|---|---|---|
| *G02F 1/1368* | (2006.01) | |
| *G02F 1/1362* | (2006.01) | |
| *H01L 29/786* | (2006.01) | |
| *H01L 27/32* | (2006.01) | |
| *H01L 27/12* | (2006.01) | |

(52) U.S. Cl.
CPC ...... *G02F 1/1368* (2013.01); *G02F 1/136286* (2013.01); *H01L 27/1225* (2013.01); *H01L 27/3276* (2013.01); *H01L 29/7869* (2013.01)

(58) Field of Classification Search
CPC ............. G02F 1/1368; G02F 1/136286; H01L 27/1225; H01L 27/3276; H01L 29/7869
See application file for complete search history.

(56) References Cited

U.S. PATENT DOCUMENTS

| | | | | |
|---|---|---|---|---|
| 2007/0034874 A1* | 2/2007 | Arao | ................ | H01L 29/78621 257/59 |
| 2010/0244029 A1* | 9/2010 | Yamazaki | ......... | H01L 29/42384 257/52 |
| 2011/0024751 A1* | 2/2011 | Yamazaki | ........... | H01L 27/1225 257/57 |
| 2011/0079783 A1* | 4/2011 | Choi | .................. | H01L 51/5265 257/59 |
| 2012/0146035 A1* | 6/2012 | Kuwabara | ........... | H01L 27/1255 257/59 |
| 2014/0159008 A1* | 6/2014 | Jeong | ................ | H01L 29/42384 257/40 |
| 2014/0291669 A1* | 10/2014 | Ji | ...................... | H01L 29/66969 257/43 |
| 2014/0339542 A1* | 11/2014 | Yamazaki | ........... | H01L 29/7869 257/43 |
| 2016/0197196 A1* | 7/2016 | Oh | ...................... | H01L 27/1259 257/66 |
| 2017/0110527 A1* | 4/2017 | Li | ...................... | H01L 27/3262 |

* cited by examiner

*Primary Examiner* — Hoan C Nguyen
(74) *Attorney, Agent, or Firm* — Seed IP Law Group LLP

(57) ABSTRACT

Embodiments of the disclosure are related to display devices, a planarization layer disposed on a thin film transistor in a display panel is removed to form an opening in the planarization layer, and a top gate electrode is disposed in the opening of the planarization layer, thus a driving performance of the thin film transistor is enhanced while reducing a size of the thin film transistor disposed in the display panel. Furthermore, the top gate electrode is implemented using an electrode layer located on an upper layer of the planarization layer, the thin film transistor including double gate electrodes is implemented easily without an additional process.

25 Claims, 13 Drawing Sheets

DISPLAY DEVICE

CROSS REFERENCE TO RELATED APPLICATION

This application claims priority from Korean Patent Application No. 10-2019-0159571, filed Dec. 4, 2019, which is hereby incorporated by reference for all purposes as if fully set forth herein.

BACKGROUND

Technical Field

Embodiments of the disclosure are related to display devices.

Description of Related Art

The growth of the information society leads to increased demand for display devices to display images and use of various types of display devices, such as liquid crystal display devices, organic light emitting display devices, etc.

A display device may include a display panel with a plurality of subpixels and various signal lines, and various driving circuits to supply signals or voltages for driving the subpixels. And the driving circuits, in some cases, may be disposed on the display panel.

Subpixels or driving circuits disposed in a display panel may include various circuit elements such as a thin film transistor. And a size of the thin film transistor may increase according to a performance required.

BRIEF SUMMARY

The inventors of the present disclosure realized that if a size of a thin film transistor disposed in a display panel is increased, a bezel area of the display panel may also be increased and aperture ratios in an active area of the display panel may be reduced. Thus, the inventors came up with various methods for implementing the thin film transistor with high performance while reducing an area where the thin film transistor is disposed. Accordingly, some embodiments of the disclosure provide a method for enhancing a driving performance of a thin film transistor disposed on a display panel without increasing a size of the thin film transistor.

Embodiments of the disclosure provide a method for enhancing a driving performance of a thin film transistor disposed on a display panel without additional processes for a performance enhancement of the thin film transistor.

According to various embodiments of the disclosure, a display device comprises a substrate comprising an active area where a plurality of subpixels are disposed and a non-active area positioned outside the active area, a plurality of thin film transistors disposed on the substrate, and a planarization layer disposed in at least a portion of the active area and the non-active area on the substrate, wherein at least one of the plurality of thin film transistors comprises a first gate electrode on the substrate, a semiconductor layer on the first gate electrode, and a second gate electrode on the semiconductor layer.

Here, the planarization layer is located in a layer between a layer where the second gate electrode is disposed and a layer where the semiconductor layer is disposed, and the planarization layer is disposed on at least a portion of an area except for an area where the second gate electrode and a channel region of the semiconductor layer are overlapped. And a part of the second gate electrode may be located on the planarization layer.

The second gate electrode may be electrically connected to the first gate electrode through a contact hole included in the planarization layer in an area except for an area where the semiconductor layer is disposed.

Alternatively, the second gate electrode is insulated from the first gate electrode, and second gate electrode is supplied a same signal as a signal supplied to the first gate electrode.

According to various embodiments of the disclosure, a display device comprises a plurality of first gate lines, a plurality of semiconductor layers located on the first gate line and overlapped with a part of the first gate line, a planarization layer located on the semiconductor layer and disposed on an area except for at least a portion of an area where the semiconductor layer is disposed, and a plurality of second gate lines located on the semiconductor layer and the planarization layer and overlapped with at least a part of an area where the first gate line and the semiconductor layer are overlapped.

According to various embodiments of the disclosure, a display device comprises a substrate, a plurality of thin film transistors disposed on the substrate, a planarization layer disposed on the thin film transistor and comprising at least one opening located in an area overlapped with the thin film transistor, and a plurality of auxiliary electrode pattern disposed in the opening included in the planarization layer and disposed on a portion of an area on the planarization layer.

According to various embodiments of the disclosure, a planarization layer disposed on a channel region of a thin film transistor comprising a bottom gate electrode is removed, and a top gate electrode is disposed on that area, thus the thin film transistor with high performance could be implemented while reducing an area where the thin film transistor is disposed.

Furthermore, the top gate electrode of the thin film transistor is implemented using one electrode layer of electrode layers located on the planarization layer, thus a driving performance of the thin film transistor could be enhanced without adding a separate process.

DESCRIPTION OF THE SEVERAL VIEWS OF THE DRAWINGS

The above and other technical benefits, features, and advantages of the present disclosure will be more clearly understood from the following detailed description, taken in conjunction with the accompanying drawings, in which.

DETAILED DESCRIPTION

Figure 1:
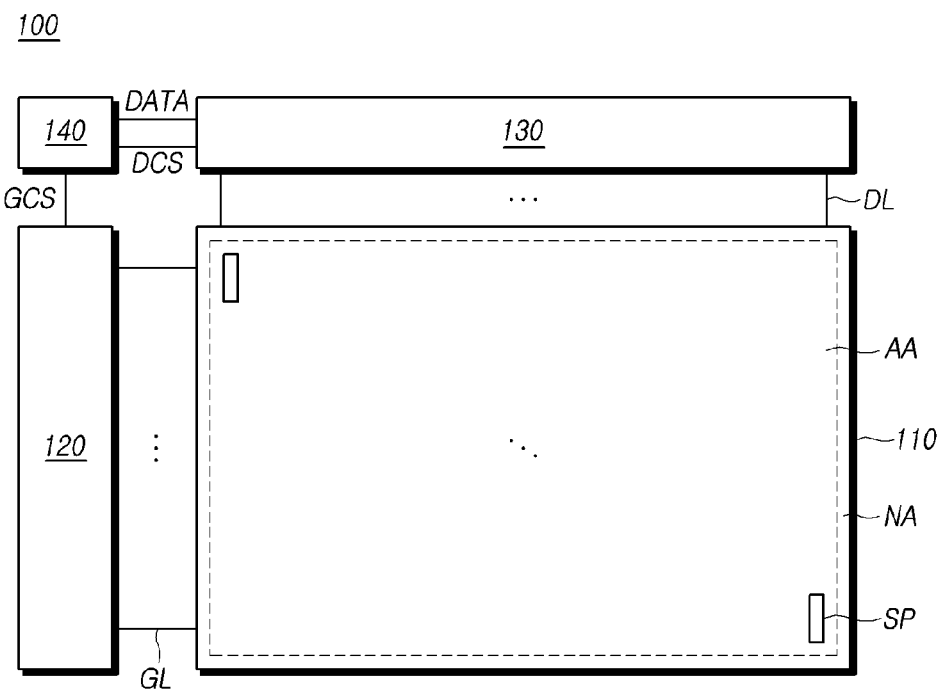
FIG. 1 is a view schematically illustrating a configuration of a display device according to various embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a view schematically illustrating a configuration of a display device 100 according to various embodiments of the disclosure.

Referring to FIG. 1, a display device 100 may include a display panel 110 including an active area AA and a non-active area NA, a gate driving circuit 120, a data driving circuit 130, and a controller 140 for driving the display panel 110.

The display panel 110 may include a plurality of gate lines GL, a plurality of data lines DL, and subpixels SP adjacent at the crossings of the gate lines GL and the data lines DL.

The gate driving circuit 120 may be controlled by the controller 140 to sequentially output scan signals to the plurality of gate lines GL disposed in the display panel 110, controlling the driving timing of the subpixels SP.

The gate driving circuit 120 may include one or more gate driver integrated circuits (GDICs). Depending on driving schemes, the gate driving circuit 120 may be positioned on only one side, or each of two opposite sides, of the display panel 110.

Each gate driver integrated circuit (GDIC) may be connected to a bonding pad of the display panel 110 by a tape automated bonding (TAB) scheme or a chip on glass (COG) scheme, or may be directly disposed on the display panel 110 by implementing as a GIP (Gate In Panel) type, in some cases, may be integrated and disposed on the display panel 110. Furthermore, each gate driver integrated circuit (GDIC) may be implemented by a chip on film (COF) scheme which each gate driver integrated circuit (GDIC) is mounted on a film connected to the display panel 110.

The data driving circuit 130 receives image data from the controller 140 and converts the image data into an analog data voltage. The data driving circuit 130 outputs a data voltage to each data line DL according to the timing of applying a scan signal via the gate line GL, allowing each subpixel SP to represent a brightness according to the image data.

The data driving circuit 130 may include one or more source driver integrated circuits (SDICs).

Each source driver integrated circuit (SDIC) may include a shift register, a latch circuit, a digital to analog converter, an output buffer, and the like.

Each source driver integrated circuit (SDIC) may be connected to a bonding pad of the display panel 110 by a tape automated bonding (TAB) scheme or a chip on glass (COG) scheme, or may be directly disposed on the display panel 110, in some cases, may be integrated and disposed on the display panel 110. Furthermore, each source driver integrated circuit (SDIC) may be implemented by a chip on film (COF) scheme, in this case, each source driver integrated circuit (SDIC) may be mounted on a film connected to the display panel 110 and electrically connected to the display panel 110 through wires on the film.

The controller 140 supplies various control signals to the gate driving circuit 120 and the data driving circuit 130 and controls the operation of the gate driving circuit 120 and the data driving circuit 130.

The controller 140 is mounted on a printed circuit board, a flexible printed circuit, and the like, and electrically connected to the gate driving circuit 120 and the data driving circuit 130 through the printed circuit board, the flexible printed circuit, and the like.

The controller 140 enables the gate driving circuit 120 to output scan signals according to the timing of implementing each frame, converts image data received from the outside to meet the data signal format used by the data driving circuit 130, and outputs the resultant image data to the data driving circuit 130.

The controller 140 receives, from the outside (e.g., a host system), various timing signals including a vertical synchronization signal VSYNC, a horizontal synchronization signal HSYNC, an input data enable signal IDE, and a clock signal, along with the image data.

The controller 140 may generate a diversity of control signals using the timing signals received from the outside and output the control signals to the gate driving circuit 120 and the data driving circuit 130.

As an example, to control the gate driving circuit 120, the controller 140 outputs various gate control signals GCS including a gate start pulse GSP, a gate shift clock GSC, and a gate output enable signal GOE.

The gate start pulse GSP controls the operation start timing of one or more gate driver integrated circuits (GDICs) constituting the gate driving circuit 120. The gate shift clock GSC is a clock signal commonly input to one or more gate driver integrated circuits (GDICs) and controls the shift timing of the scan signals. The gate output enable signal GOE designates timing information about one or more gate driver integrated circuits (GDICs).

To control the data driving circuit 130, the controller 140 outputs various data control signals DCS including, e.g., a source start pulse SSP, a source sampling clock SSC, and a source output enable signal SOE.

The source start pulse SSP controls the data sampling start timing of one or more source driver integrated circuits (SDICs) constituting the data driving circuit 130. The source sampling clock SSC is a clock signal for controlling the sampling timing of data in each source driver integrated circuit (SDIC). The source output enable signal SOE controls the output timing of the data driving circuit 130.

The display device 100 may further include a power management integrated circuit that supplies various voltages or currents to, e.g., the display panel 110, the gate driving circuit 120, and the data driving circuit 130 or controls various voltages or currents to be supplied.

Each subpixel SP may be a region adjacently formed at crossing of the gate line GL and the data line DL, a liquid crystal or a light emitting element may be disposed in the subpixel SP according to types of the display device 100.

For an example, when the display device 100 is a liquid crystal display device, the display device 100 include a light source device like a backlight unit providing a light to the display panel 110, and a liquid crystal is disposed in the subpixel SP. The display device 100 controls arrangements of the liquid crystal by an electric field formed when a data voltage is supplied to each subpixel SP, and the display device 100 may display an image by representing a brightness according to a video data.

For another example, when the display device 100 is an organic light emitting display device, an organic light emitting diode (OLED) and various circuit elements may be disposed on the plurality of subpixels SP. The display device 100 controls a current supplied to the organic light emitting diode (OLED) disposed in the subpixel SP, each subpixel SP may represent a brightness corresponding to a video data.

Alternatively, the light emitting element disposed in the subpixel SP may be light emitting diode (LED) or micro light emitting diode (LED).

These subpixels or abovementioned driving circuits may include a plurality of thin film transistors for driving subpixels SP and the like. And if a size of the thin film transistor is increased to enhance a driving performance of the thin film transistor, an aperture ratio of the subpixel SP may be reduced or an area of the non-active area NA may be increased.

According to various embodiments of the disclosure, methods are provided to enhance a driving performance of a thin film transistor while reducing a size of the thin film transistor without additional processes.

Figure 2:
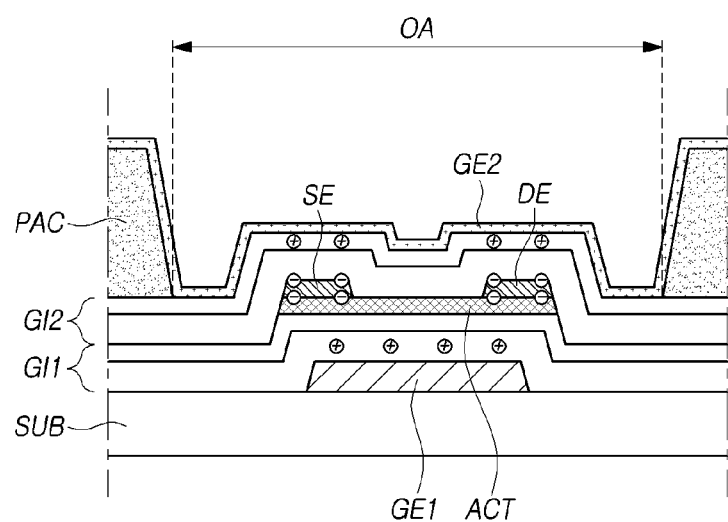
FIG. 2 is a view illustrating an example of a structure which a thin film transistor according to various embodiments of the disclosure is disposed in a display panel.

FIG. 2 is a view illustrating an example of a structure which a thin film transistor according to various embodiments of the disclosure is disposed in the display panel 110.

Referring to FIG. 2, a thin film transistor may be a thin film transistor disposed on the active area AA or the non-active area NA.

A thin film transistor according to various embodiments of the disclosure, for example, may include a first gate electrode GE1 as a bottom gate electrode and a second gate electrode GE2 as a top gate electrode.

Here, the second gate electrode GE2 may be implemented using an electrode layer disposed on a planarization layer PAC which is disposed after disposing a semiconductor layer ACT of the thin film transistor and the like.

Specifically, the first gate electrode GE1 may be disposed on a substrate SUB, and a first gate insulation layer GI1 may be disposed on the first gate electrode GE1. The first gate insulation layer GI1, in some cases, may include two or more layers, for example, may be a structure stacked of $SiN_x$, $SiO_2$ and the like.

The semiconductor layer ACT may be disposed on the first gate insulation layer GI1. And a source electrode SE and a drain electrode DE may be disposed on the semiconductor layer ACT.

A second gate insulation layer GI2 may be disposed on the source electrode SE and the drain electrode DE. The second gate insulation layer GI2, in some cases, may include two or more layers, may be a structure stacked of $SiN_x$, $SiO_2$ and the like, similarly to the first gate insulation layer GI1.

The planarization layer PAC may be disposed on the second gate insulation layer GI2.

The planarization layer PAC may include at least one opening OA located in an area corresponding to the thin film transistor.

For example, the opening OA included in the planarization layer PAC may be located in an area overlapping with the semiconductor layer ACT of the thin film transistor or an area comprising an area overlapping with the semiconductor layer ACT. Alternatively, the opening OA of the planarization layer PAC may be located in an area overlapping with a channel region of the semiconductor layer ACT of the thin film transistor.

Here, the channel region of the semiconductor layer ACT, for example, may mean a region where the semiconductor layer ACT and the first gate electrode GE1 are overlapped.

As the opening OA of the planarization layer PAC is located in an area corresponding to the thin film transistor, the planarization layer PAC may be removed in an area corresponding to the thin film transistor. Thus, a part of the second gate electrode GE2 disposed under the planarization layer PAC may be exposed by the opening OA of the planarization layer PAC.

And the second gate electrode GE2 may be disposed on the second gate insulation layer GI2 in the opening OA of the planarization layer PAC.

The second gate electrode GE2 may be disposed using an electrode layer disposed on an upper layer of the planarization layer PAC.

For example, the second gate electrode GE2 may be disposed using a same material with a pixel electrode PXL or a common electrode COM disposed on an upper layer of the planarization layer PAC. That is, the second gate electrode GE2 may be disposed on a same layer with the pixel electrode PXL or the common electrode COM.

Thus, the second gate electrode GE2 may be disposed on the semiconductor layer ACT without adding separate processes or electrode layers.

The second gate electrode GE2 may be overlapped with the semiconductor layer ACT. Alternatively, the second gate electrode GE2 may be overlapped with an area where the first gate electrode GE1 and the semiconductor layer ACT are overlapped.

And a part of the second gate electrode GE2 may be disposed on a partial area on the planarization layer PAC.

As the second gate electrode GE2 is disposed on the second gate insulation layer GI2 in the opening OA and is overlapped with the semiconductor layer ACT, the second gate electrode GE2 may compose double gate electrodes with the first gate electrode GE1 disposed under the semiconductor layer ACT.

That is, as the planarization layer PAC disposed on the semiconductor layer ACT is removed, a channel may be formed in the semiconductor layer ACT by an electric field formed by the second gate electrode GE2 implemented using an electrode layer located on the planarization layer PAC. Thus, since the channel may be formed by the first gate electrode GE1 and the second gate electrode GE2, a mobility of the thin film transistor may be increased. And according to an increase of the mobility, a current flowing through the semiconductor layer ACT may be increased.

Thus, by increasing a current characteristic of the thin film transistor while reducing a size of the thin film transistor, a driving performance of the thin film transistor may be enhanced.

Furthermore, as the second gate electrode GE2 is disposed to overlap a periphery area including the semiconductor layer ACT, the second gate electrode GE2 may provide an element protection function like an electrostatic shielding which is introduced from outside.

This may represent that an auxiliary electrode pattern for an element protection and the like is disposed in the opening OA of the planarization layer PAC and a periphery area by using an electrode layer on an upper layer of the planarization layer PAC and a part of the auxiliary electrode pattern performs a function of a top gate electrode.

As described above, according to various embodiments of the disclosure, by forming the opening OA in the planarization layer PAC and implementing the second gate electrode GE2 using an electrode layer disposed on an upper layer of the planarization layer PAC, a driving performance of the thin film transistor disposed in the display panel 110 may be enhanced without additional processes.

Here, the second gate electrode GE2 may be disposed to be insulated from the first gate electrode GE1. And a same signal as a signal supplied to the first gate electrode GE1 may be supplied to the second gate electrode GE2.

Alternatively, the second gate electrode GE2 may be electrically connected to the corresponding first gate electrode GE1.

Figure 3:
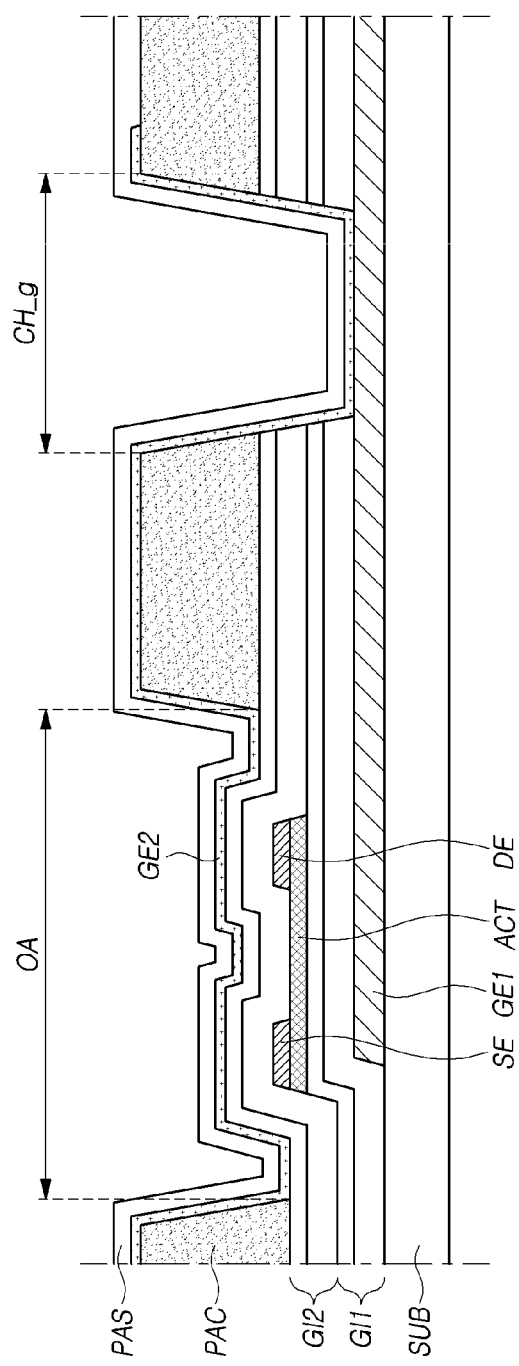
FIGS. 3 and 4 are views illustrating examples of structures which a bottom gate electrode and a top gate electrode of a thin film transistor according to various embodiments of the disclosure is connected.
Figure 4:
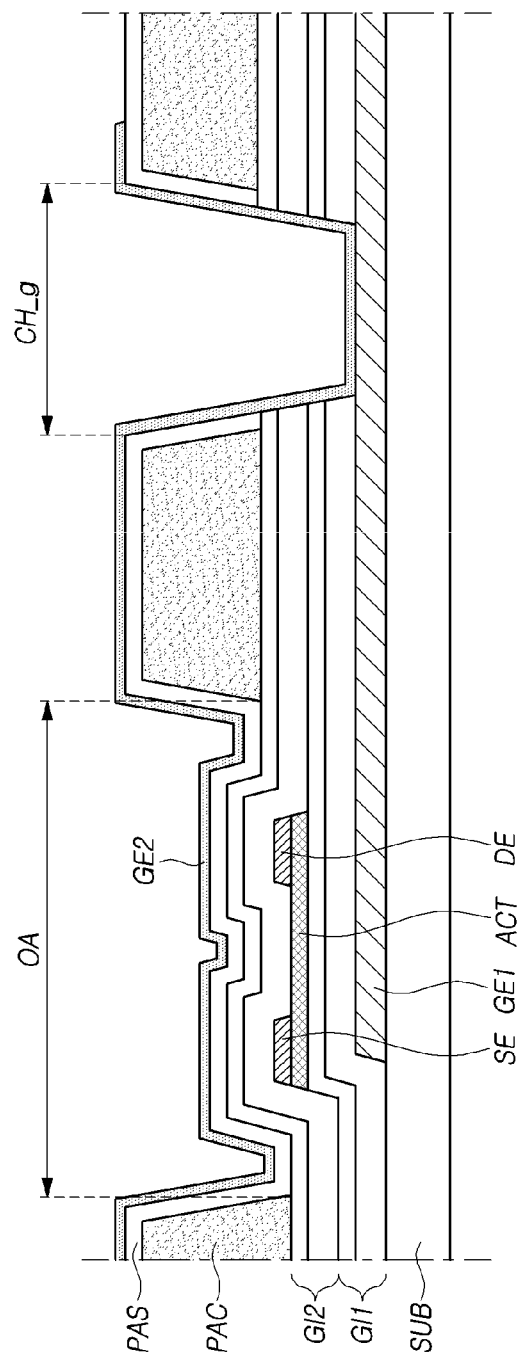

FIGS. 3 and 4 are views illustrating examples of structures which a bottom gate electrode and a top gate electrode of a thin film transistor according to various embodiments of the disclosure is connected.

FIG. 3 shows an example that the second gate electrode GE2 is implemented by using the common electrode COM positioned on an upper layer of the planarization layer PAC, and FIG. 4 shows an example that the second gate electrode GE2 is implemented by using the pixel electrode PXL positioned on an upper layer of the planarization layer PAC.

And FIGS. 3 and 4 show examples in case that the pixel electrode PXL is disposed on an upper layer than the common electrode COM, but, in some cases, the common electrode COM may be disposed on an upper layer than the pixel electrode PXL, or the pixel electrode PXL and the common electrode COM may be disposed on a same layer.

Referring to FIG. 3, the first gate electrode GE1 is disposed under the semiconductor layer ACT, and the opening OA of the planarization layer PAC may be positioned in an area including an area overlapping with the semiconductor layer ACT or a channel region of the semiconductor layer ACT.

And the second gate electrode GE2 may be disposed on a same layer with the common electrode COM disposed on the planarization layer PAC.

That is, in a process disposing the common electrode COM, the second gate electrode GE2 may be implemented, by disposing the auxiliary electrode pattern made of a same material as the common electrode COM and separated from the common electrode COM in the opening OA of the planarization layer PAC.

A protective layer PAS may be disposed on the second gate electrode GE2 for an insulation of the common electrode COM and the pixel electrode PXL.

The second gate electrode GE2 is disposed to be overlapped with an area where the semiconductor layer ACT is disposed and a periphery area of the area, and electrically connected to the first gate electrode GE1 positioned under the planarization layer PAC through a contact hole CH_g positioned in an area except for an area where the semiconductor layer ACT is disposed.

That is, the planarization layer PAC may have a structure removed in an area where the semiconductor layer ACT of a thin film transistor is disposed and an area where the first gate electrode GE1 and the second gate electrode GE2 are connected.

Here, the planarization layer PAC may not be disposed on a position of the contact hole CH_g in a process of disposing the planarization layer PAC. Alternatively, in a state that the planarization layer PAC is disposed on a position of the contact hole CH_g, the planarization layer PAC may be removed in a process of forming a contact hole CH_g in a gate insulation layer and the like disposed under the planarization layer PAC.

In this way, the first gate electrode GE1 and the second gate electrode GE2 are easily electrically connected through the contact hole CH_g to form double gate electrodes.

Furthermore, the second gate electrode GE2 may be implemented by using the pixel electrode PXL positioned on the uppermost layer among electrode layers positioned on the planarization layer PAC.

Referring to FIG. 4, the first gate electrode GE1 may be disposed on the substrate SUB, and the semiconductor layer ACT may be disposed on the first gate electrode GE1. The planarization layer PAC comprising the opening OA at a position corresponding to the semiconductor layer ACT may be disposed on the semiconductor layer ACT.

The protective layer PAS may be disposed in the opening OA of the planarization layer PAC and the planarization layer PAC for an insulation between the common electrode COM and the pixel electrode PXL.

And the second gate electrode GE2 made of a same material as the pixel electrode PXL may be disposed on the protective layer PAS.

The second gate electrode GE2 may be disposed on the protective layer PAS positioned in the opening OA of the planarization layer PAC. Furthermore, the second gate electrode GE2 may be disposed on the protective layer PAS positioned on the planarization layer PAC. And the second gate electrode GE2 may be electrically connected to the first gate electrode GE1 positioned under the planarization layer PAC through the contact hole CH_g.

As the second gate electrode GE2 is disposed by using an electrode layer positioned on the uppermost layer among electrode layers positioned on upper layers of the planarization layer PAC, the contact hole CH_g may be formed after completing dispositions of electrode layers and insulation layers positioned under the uppermost layer.

Accordingly, the contact hole CH_g for a connection between the first gate electrode GE1 and the second gate electrode GE2 may be formed easily.

In this way, as a portion of the planarization layer PAC positioned on the semiconductor layer ACT is removed and the second gate electrode GE2 is disposed by using an electrode layer positioned on the planarization layer PAC, a driving performance of a thin film transistor may be enhanced while reducing a size of the thin film transistor.

And as a size of a thin film transistor disposed in the display panel 110 is reduced, the non-active area NA where the thin film transistor is disposed may be reduced, or an aperture ratio in the active area AA may be increased.

Furthermore, according to various embodiments of the disclosure, as the semiconductor layer ACT of a thin film transistor is disposed as double layers having different composition ratios of material included in the semiconductor layer ACT, a driving performance of the thin film transistor may be enhanced while reducing a size of the thin film transistor.

Figure 5:
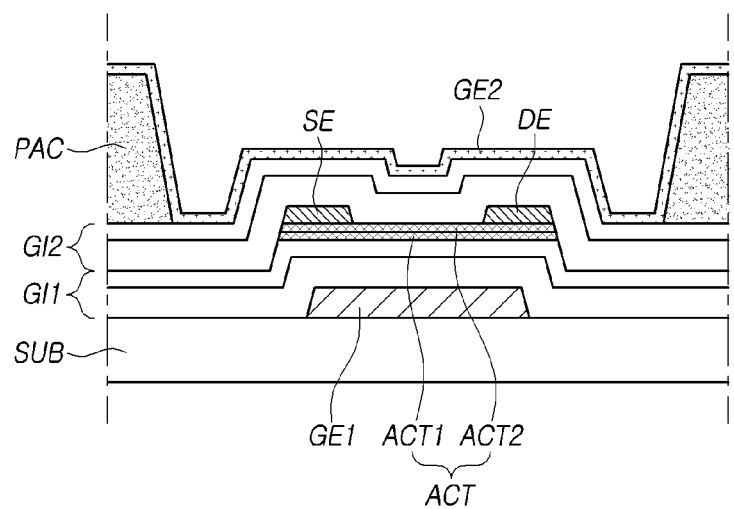
FIG. 5 is a view illustrating another example of a structure which a thin film transistor according to various embodiments of the disclosure is disposed in a display panel.

FIG. 5 is a view illustrating another example of a structure which a thin film transistor according to various embodiments of the disclosure is disposed in the display panel 110.

Referring to FIG. 5, the first gate electrode GE1 may be disposed on the substrate SUB, and the semiconductor layer ACT may be positioned on the first gate electrode GE1.

The planarization layer PAC positioned on the semiconductor layer ACT may be a structure removed in an area corresponding to the semiconductor layer ACT. And the second gate electrode GE2 implemented by using an electrode layer positioned on an upper layer of the planarization layer PAC may be disposed in the area where the planarization layer PAC is removed and a periphery area of the area.

Here, the semiconductor layer ACT, for example, may be an oxide semiconductor.

And the semiconductor layer ACT comprises a first oxide semiconductor layer ACT1 positioned on the first gate insulation layer GI1 and a second oxide semiconductor layer ACT2 positioned on the first oxide semiconductor layer ACT1.

A composition ratio of materials included in the first oxide semiconductor layer ACT1 may be different from a composition ratio of materials included in the second oxide semiconductor layer ACT2.

For example, the first oxide semiconductor layer ACT1 and the second oxide semiconductor layer ACT2 comprises indium, gallium, zinc.

A composition ratio of indium, gallium, zinc included in the first oxide semiconductor layer ACT1 may be 1:1:1. And a content of gallium included in the second oxide semiconductor layer ACT2 may be higher than a content of indium and a content of zinc included in the second oxide semiconductor layer ACT2.

That is, the first oxide semiconductor layer ACT1 may be formed by comprising indium, gallium, zinc as a same ratio, the second oxide semiconductor layer ACT2 may be formed by comprising more gallium relatively.

Here, a resistivity of the second oxide semiconductor layer ACT2 that a composition ratio of indium, gallium, zinc is not uniform may be high. When the second oxide semiconductor layer ACT2 having a high resistivity is disposed on the first oxide semiconductor layer ACT1, even if a channel length is short, a variation of a threshold voltage of a thin film transistor may be small.

Accordingly, a uniformity of driving characteristics of a thin film transistor may be maintained while reducing a size of the thin film transistor disposed in the display panel 110.

As improving current characteristics of a thin film transistor by the second gate electrode GE2 disposed in the opening OA of the planarization layer PAC, and maintaining a uniformity of driving characteristics of a thin film transistor even if a size of the thin film transistor is reduced, a driving performance of the thin film transistor may be enhanced while reducing or minimizing a size of the thin film transistor disposed in the display panel 110.

And as an area where a thin film transistor is disposed is reduced while enhancing a performance of the thin film transistor, an area where a driving circuit is disposed in the non-active area NA of the display panel 110 may be reduced, or an aperture ratio of the subpixel SP disposed in the active area AA may be increased.

Figure 6:
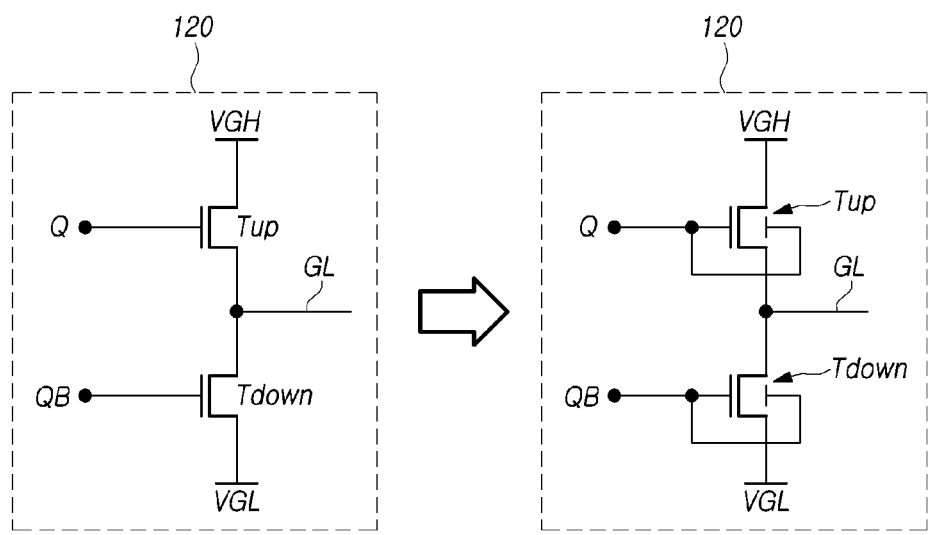
FIGS. 6, 7, and 8 are views illustrating examples which a thin film transistor according to various embodiments of the disclosure is implemented in a non-active area of a display panel.
Figure 7:
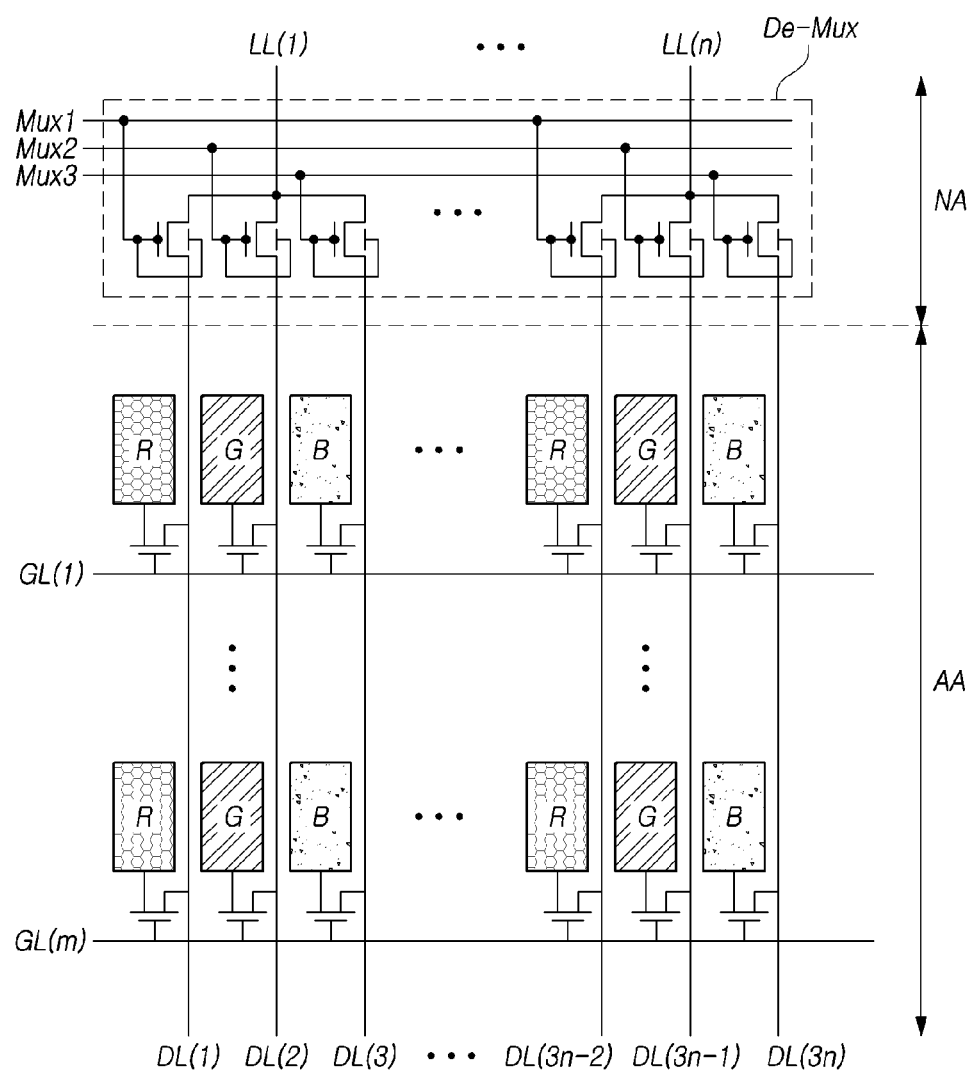
Figure 8:
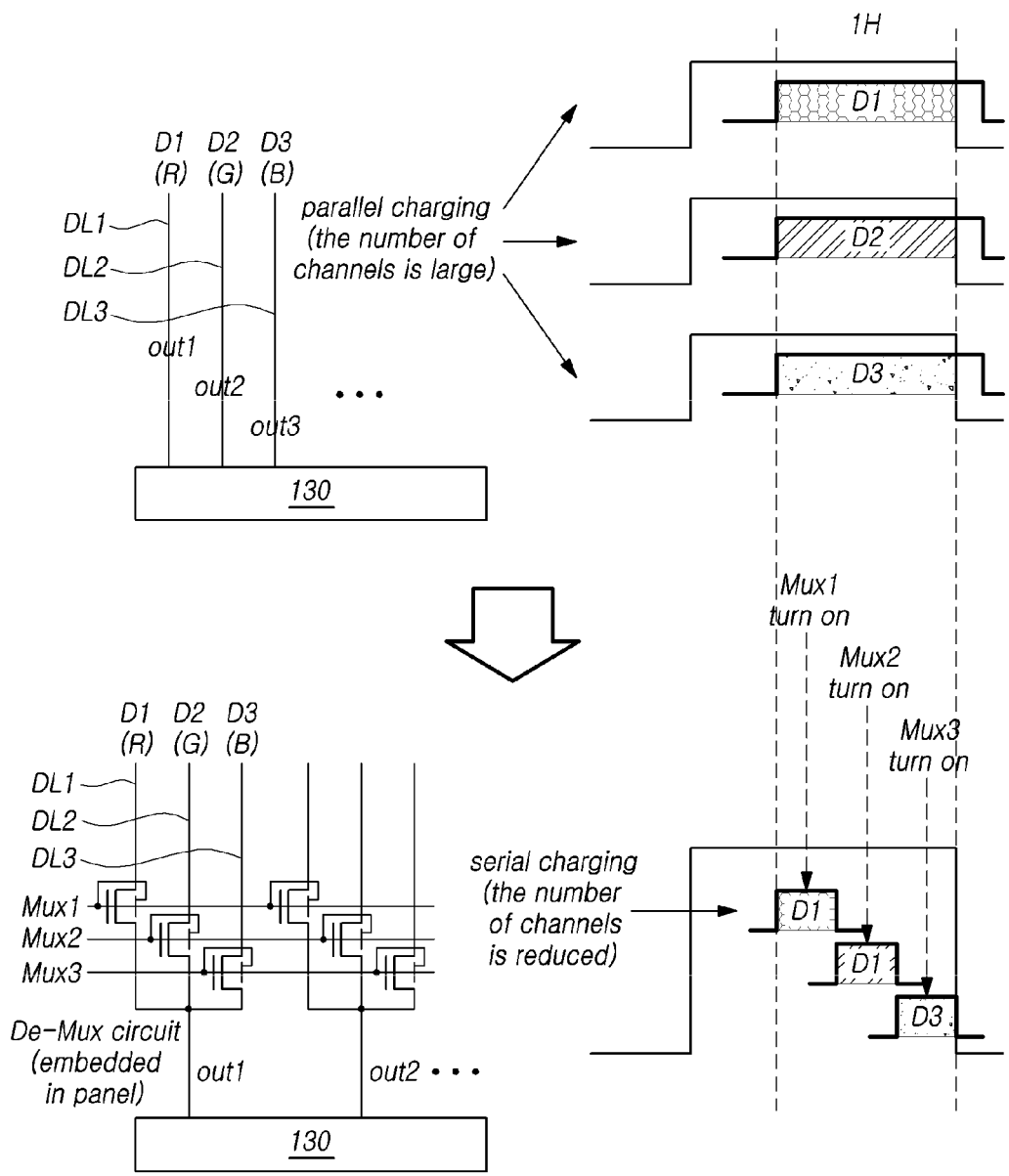

FIGS. 6, 7, and 8 are views illustrating examples which a thin film transistor according to various embodiments of the disclosure is implemented in the non-active area NA of the display panel 110.

Referring to FIG. 6, the gate driving circuit 120 included in the display device 100 may be disposed on the non-active area NA of the display panel 110 as a GIP type. And the gate driving circuit 120, for example, may comprise a pull-up transistor Tup configured to control a supply of a gate high voltage VGH to the gate line GL and a pull-down transistor Tdown configured to control a supply of a gate low voltage VGL to the gate line GL.

The pull-up transistor Tup may be controlled by a voltage level of a Q node, and the pull-down transistor Tdown may be controlled by a voltage level of a QB node.

Furthermore, the gate driving circuit 120 may comprise a plurality of thin film transistors to control the voltage level of the Q node and the voltage level of the QB node.

A thin film transistor included in this gate driving circuit 120, like as a thin film transistor according to various embodiments of the disclosure abovementioned, may comprise the first gate electrode GE1 disposed under the semiconductor layer ACT and the second gate electrode GE2 positioned on the semiconductor layer ACT and disposed in the opening OA of the planarization layer PAC.

And the second gate electrode GE2 may be electrically connected to the first gate electrode GE1 to form double gate electrodes.

Accordingly, as reducing a size of a thin film transistor included in the gate driving circuit 120, an area for disposing the gate driving circuit 120 is reduced and the non-active area NA may be reduced.

Furthermore, a portion of the second gate electrode GE2 may be disposed on a periphery area of the opening OA.

Accordingly, a thin film transistor disposed in an outer region of the display panel 110 that is vulnerable to external electrostatic or the like may be protected by the second gate electrode GE2.

In this way, according to various embodiments of the disclosure, as reducing a size of a thin film transistor disposed in the display panel 110, an increase of the non-active area NA may be reduced or minimized in a case that a driving circuit is disposed on the non-active area NA of the display panel 110.

Alternatively, since it is possible to reduce a size of a thin film transistor, as disposing a multiplexing circuit or a de-multiplexing circuit in the non-active area NA, the number of wires disposed on the display panel 110 may be reduced.

Referring to FIGS. 7 and 8, the de-multiplexing circuit comprising a plurality of thin film transistors may be disposed on the non-active area NA.

The thin film transistor included in the de-multiplexing circuit may be electrically connected between the data line DL and a link line LL. And the link line LL may be a signal wire electrically connected to the data driving circuit 130.

Here, each of the plurality of thin film transistor included in the de-multiplexing circuit may be electrically connected to one data line DL. And two or more thin film transistor may be electrically connected to same link line LL.

For example, like as an example illustrated in FIG. 7, three thin film transistors may be electrically connected to one link line LL. And each of three thin film transistors may be controlled by a multiplexing signal.

Accordingly, one link line LL, that is, one channel included in the data driving circuit 130 may drive three data lines DL.

For example, referring to FIGS. 7 and 8, a data voltage D1(R) for driving a red subpixel SP may be supplied to the data line DL during a period which a thin film transistor controlled by a first multiplexing signal Mux1 is turned on.

And a data voltage D2(G) for driving a green subpixel SP may be supplied to the data line DL during a period which a thin film transistor controlled by a second multiplexing signal Mux2 is turned on, and a data voltage D3(B) for driving a blue subpixel SP may be supplied to the data line during a period which a thin film transistor controlled by a third multiplexing signal Mux3 is turned on.

As a thin film transistor included in the de-multiplexing circuit comprises double gate electrodes, a current supply performance of the thin film transistor is enhanced, and data voltages may be supplied to each of the subpixels SP sufficiently even if a period supplying data voltages to each of the data lines DL is shorten by the de-multiplexing circuit.

Accordingly, while maintaining a performance supplying data voltages to the subpixels SP, the number of channels included in the data driving circuit 130 and the number of link lines LL electrically connected to the data driving circuit 130 and disposed on the non-active area NA may be reduced.

Furthermore, a thin film transistor according to various embodiments of the disclosure may be included in the subpixel SP disposed on the active area AA of the display panel 110.

Figure 9:
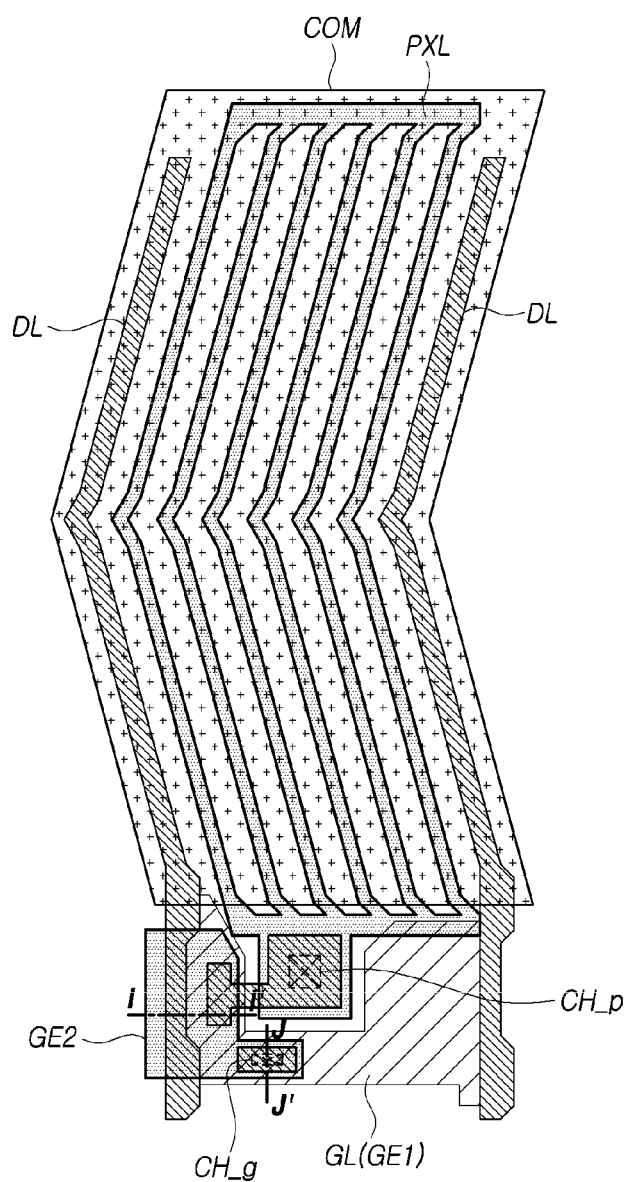
FIG. 9 is a view illustrating an example which a thin film transistor according to various embodiments of the disclosure is implemented in an active area of a display panel.

FIG. 9 is a view illustrating an example which a thin film transistor according to various embodiments of the disclosure is implemented in the active area AA of the display panel 110. And FIG. 10 is a cross-sectional view taken along line I-I' and J-J' illustrated in FIG. 9.

Figure 10:
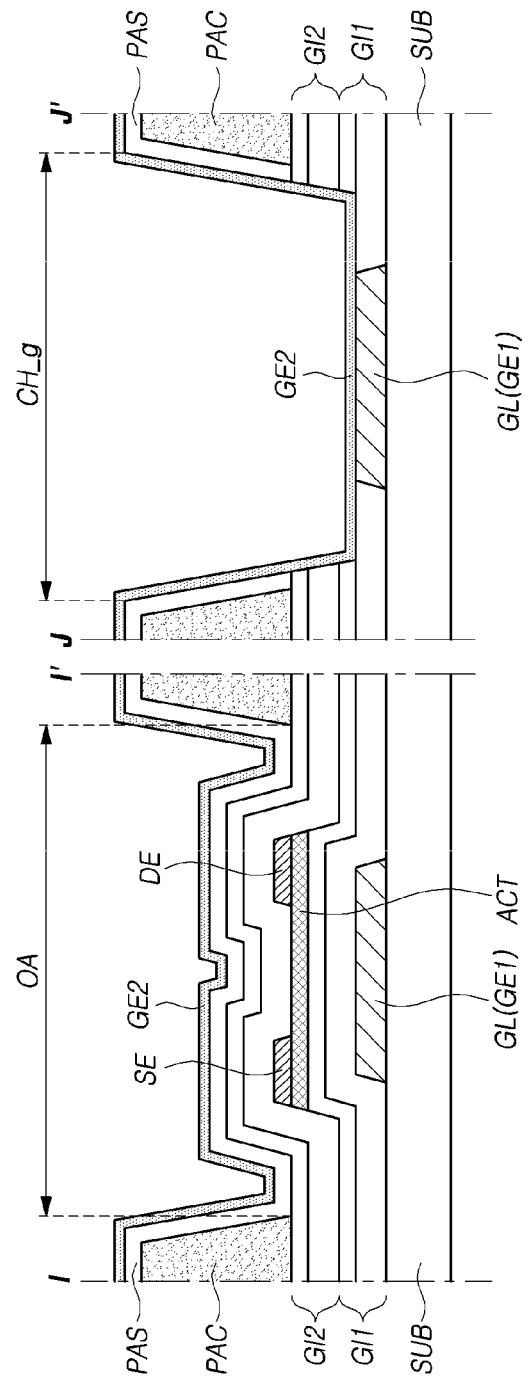
FIG. 10 is a cross-sectional view taken along line I-I' and J-J' of FIG. 9.

Referring to FIGS. 9 and 10, the subpixel SP disposed on the active area AA may comprise the gate line GL disposed in one direction and the data line DL disposed in an intersecting direction with the gate line GL. And the subpixel SP may comprise the common electrode COM disposed on two or more subpixels SP and the pixel electrode PXL disposed on each subpixel SP separately.

Examples illustrated in FIGS. 9 and 10 show examples of structure that the pixel electrode PXL is disposed on an upper layer than the common electrode COM.

Here, the subpixel SP may comprise a thin film transistor electrically connected between the data line DL and the pixel electrode PXL.

For example, a portion of the gate line GL may be constituted the first gate electrode GE1 of the thin film transistor, and a portion of the data line DL may be constituted the source electrode SE or the drain electrode DE of the thin film transistor. And the drain electrode DE or the source electrode SE disposed on a same layer with the data line DL may be electrically connected to the pixel electrode PXL through the contact hole CH_g.

Furthermore, the thin film transistor may comprise the second gate electrode GE2 disposed on a same layer with the pixel electrode PXL and made of a same material with the pixel electrode PXL.

The second gate electrode GE2, for example, may be disposed in an area including an area overlapping the semiconductor layer ACT or a channel region of the thin film transistor, and may be disposed in an area except for an area where the pixel electrode PXL is disposed. And the second gate electrode GE2 may be disposed as a certain pattern shape on the gate line GL comprising the first gate electrode GE1.

Here, the planarization layer PAC may be positioned on a layer between a layer where the semiconductor layer ACT of the thin film transistor is disposed and a layer where the pixel electrode PXL is disposed. And the planarization layer PAC may comprise the opening OA positioned in an area corresponding to the semiconductor layer ACT.

Accordingly, the second gate electrode GE2 may be disposed in the opening OA of the planarization layer PAC. Furthermore, the second gate electrode GE2 may be disposed on a periphery area of the opening OA.

And the second gate electrode GE2 may be electrically connected to the gate line GL positioned under the planarization layer PAC through the contact hole CH_g formed in the planarization layer PAC.

The second gate electrode GE2 may be disposed in an area where the pixel electrode PXL is not disposed in the subpixel SP by using a same material with the pixel electrode PXL. And as the planarization layer PAC is not disposed under the second gate electrode GE2, the thin film transistor comprising double gate electrodes may be implemented easily.

Accordingly, as a size of the thin film transistor is reduced while enhancing a driving performance of the thin film transistor disposed in the subpixel SP, an aperture ratio of the subpixel SP may be improved according to a reduction of an area where the thin film transistor is disposed.

Furthermore, as the second gate electrode GE2 is formed by using an electrode layer, like as the pixel electrode PXL or the common electrode COM, positioned on an upper layer of the planarization layer PAC, without adding a separate process, the thin film transistor having an enhanced driving performance may be implemented easily.

Furthermore, in some cases, the second gate electrode GE2 may be implemented as a shape corresponding to the gate line GL comprising the first gate electrode GE1.

Figure 11:
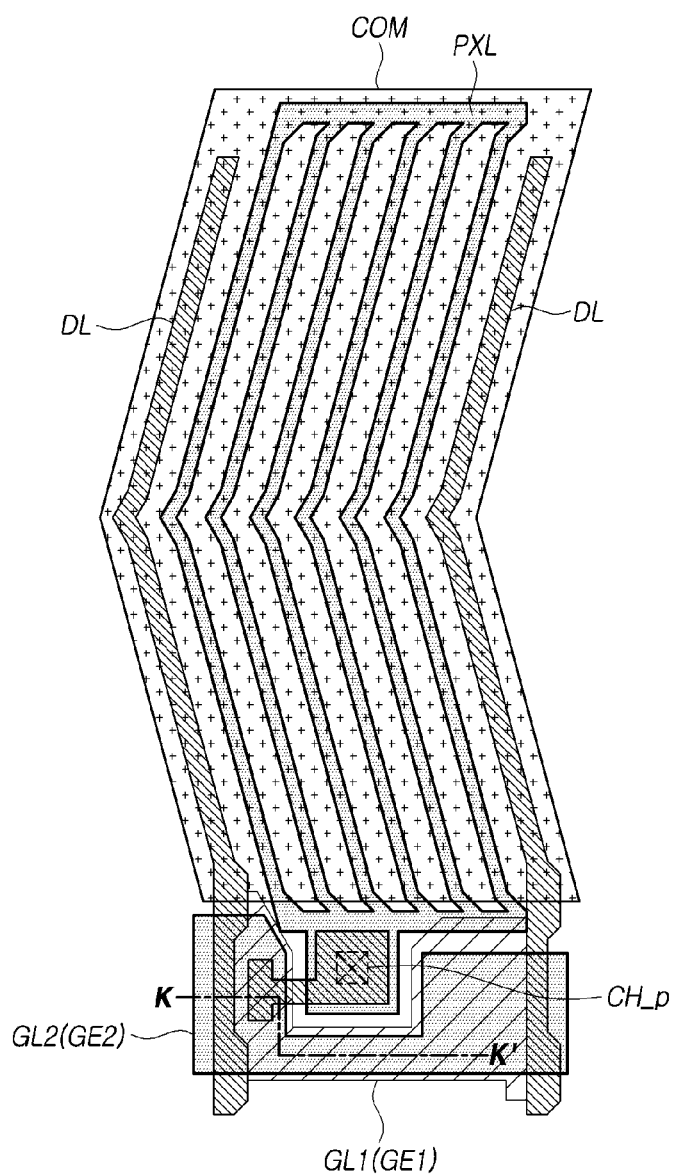
FIG. 11 is a view illustrating another example which a thin film transistor according to various embodiments of the disclosure is implemented in an active area of a display panel.
Figure 12:
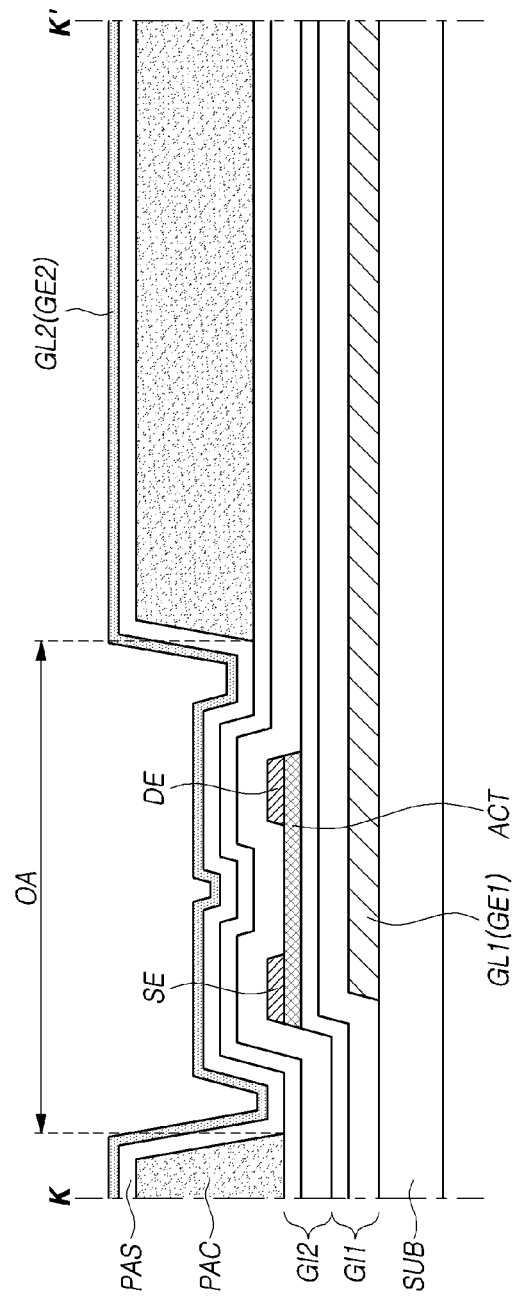
FIG. 12 is a cross-sectional view taken along line K-K' of FIG. 11.

FIG. 11 is a view illustrating another example which a thin film transistor according to various embodiments of the disclosure is implemented in the active area AA of the display panel 110. FIG. 12 is a cross-sectional view taken along line K-K' illustrated in FIG. 11.

Referring to FIGS. 11 and 12, the data line DL may be disposed in the subpixel SP in one direction. And a first gate line GL1 may be disposed in an intersecting direction with the data line DL.

The first gate line GL1 may be disposed on the substrate SUB and positioned under the semiconductor layer ACT.

And a portion of the first gate line GL1 may be overlapped with the semiconductor layer ACT to form the first gate electrode GE1.

The planarization layer PAC may be positioned on the semiconductor layer ACT. And the planarization layer PAC may comprise the opening OA positioned in an area corresponding to the semiconductor layer ACT.

The planarization layer PAC may be disposed in an area except for an area corresponding to the semiconductor layer ACT, and the common electrode COM, the protective layer PAS, the pixel electrode PXL may be disposed on the planarization layer PAC sequentially.

Here, a second gate line GL2 may be disposed in an area except for an area where the pixel electrode PXL is disposed on the planarization layer PAC.

The second gate line GL2 may be disposed on a same layer with the pixel electrode PXL, and made of a same material with the pixel electrode PXL.

And the second gate line GL2 may be disposed to be corresponded with the first gate line GL1 positioned under the semiconductor layer ACT.

Since the second gate line GL2 is disposed to be corresponded with the first gate line GL1, the second gate line GL2 may be disposed in the opening OA of the planarization layer PAC in an area where the semiconductor layer ACT is positioned. And a portion that the second gate line GL2 overlaps with the semiconductor layer ACT may be constituted the second gate electrode GE2.

This second gate line GL2 may be a structure not connecting with the first gate line GL1 in the active area AA. And a same signal with a signal supplied to the first gate line GL1 may be supplied to the second gate line GL2. Here, the first gate line GL1 and the second gate line GL2 may be supplied signals through separate signal wires.

Accordingly, a thin film transistor comprising double gate electrodes may be implemented without forming a hole for electrical connection between the first gate line GL1 and the second gate line GL2 in the subpixel SP.

Alternatively, the first gate line GL1 and the second gate line GL2 are separated in the active area AA, may be electrically connected through a hole formed in the planarization layer PAC in the non-active area NA.

Even in this case, since it is not necessary to form a hole in each subpixel SP, a thin film transistor comprising double gate electrodes may be implemented easily while reducing the number of holes for electrical connection between the first gate electrode GE1 and the second gate electrode GE2.

Furthermore, a thin film transistor according to various embodiments of the disclosure may be applied regardless of types of the display device 100. That is, various embodiments of the disclosure may be applied to all display device 100 having structures that a thin film transistor is disposed on the substrate SUB in the display panel 110, an insulation layer like the planarization layer PAC is disposed on the thin film transistor, and an electrode layer is present on the insulation layer.

Figure 13:
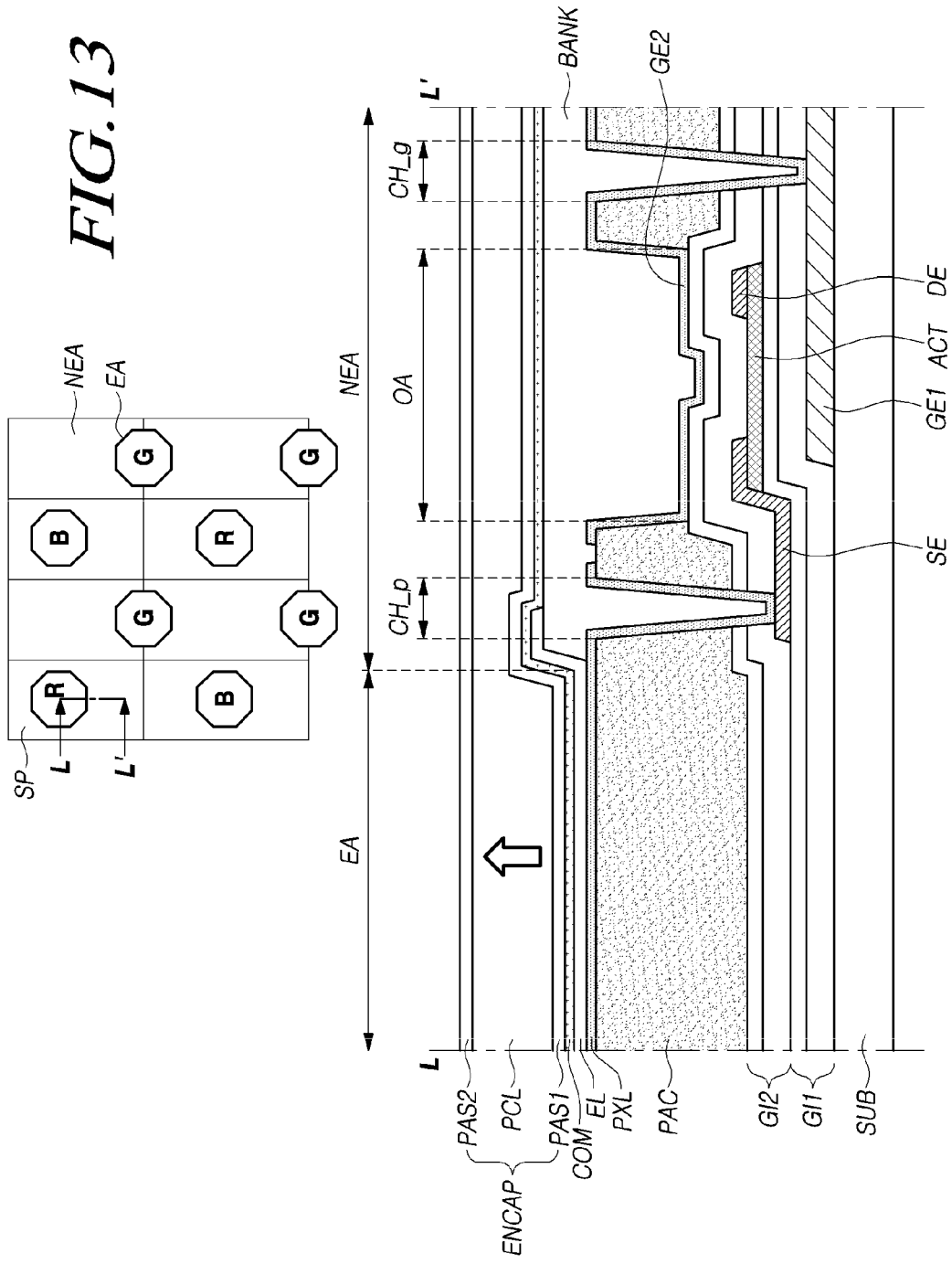
FIG. 13 is a view illustrating another example which a thin film transistor according to various embodiments of the disclosure is implemented in an active area of a display panel.

FIG. 13 is a view illustrating another example which a thin film transistor according to various embodiments of the disclosure is implemented in the active area AA of the display panel 110, and shows an example that the display device 100 is an organic light emitting display device.

And in a structure that the subpixel SP disposed in the display panel 110 of the organic light emitting display device comprises a light emitting area EA and non-light emitting area NEA, FIG. 13 illustrates a cross-sectional view taken along line L-L' being a part of the light emitting area EA and non-light emitting area NEA.

Referring FIG. 13, the first gate electrode GE1 may be disposed on the substrate SUB, the first gate insulation layer GI1 may be disposed on the first gate electrode GE1. And the semiconductor layer ACT, the source electrode SE and the drain electrode DE may be disposed on the first gate insulation layer GI1, and the second gate insulation layer GI2 may be disposed over them.

The planarization layer PAC may be disposed on the second gate insulation layer GI2. And the planarization layer PAC may comprise the opening OA positioned in an area corresponding to the semiconductor layer ACT. Furthermore, the planarization layer PAC may comprise a contact hole CH_p for an electrical connection between the pixel electrode PXL positioned on the planarization layer PAC and a thin film transistor.

The second gate electrode GE2 may be disposed in the opening OA of the planarization layer PAC. Furthermore, a portion of the second gate electrode GE2 may be disposed on a part area on the planarization layer PAC.

This second gate electrode GE2 may be made of a same material with the pixel electrode PXL, and positioned on a same layer with the pixel electrode PXL.

That is, by placing the same material with the pixel electrode PXL in the opening OA of the planarization layer PAC in a structure which the planarization layer PAC is removed in an area corresponding to the semiconductor layer ACT, a thin film transistor comprising double gate electrodes may be implemented.

Accordingly, without adding a process or a separate electrode layer, a structure that a thin film transistor disposed in the active area AA comprises double gate electrodes may be implemented easily.

This thin film transistor is a driving transistor disposed in the subpixel SP as an example, but in some cases, it may be a switching transistor other than the driving transistor.

The second gate electrode GE2 may be connected to the first gate electrode GE1 through the contact hole CH_g included in the planarization layer PAC.

A bank BANK may be disposed on the opening OA, the contact hole CH_p, CH_g of the planarization layer PAC. And a light emitting layer EL may be disposed in an area where the bank BANK is not disposed.

The common electrode COM may be disposed on the light emitting layer EL. The common electrode COM, for example, may be made of a transparent conductive material, and disposed on the active area AA comprising the subpixel SP entirely.

An encapsulation ENCAP comprising a first protective layer PAS1, a second protective layer PCL and a third protective layer PAS2 may be disposed on the common electrode COM. For example, the first protective layer PAS1 and the third protective layer PAS2 may be inorganic encapsulation layers, and the second protective layer PCL may be an organic encapsulation layer.

That is, in a case that the display device 100 is an organic light emitting display device, as the common electrode COM may be disposed on the active area AA entirely, the second gate electrode GE2 is disposed on a layer where the pixel electrode PXL is disposed and a thin film transistor comprising double gate electrodes may be implemented.

In this way, according to various embodiments of the disclosure, as removing the planarization layer PAC positioned on an area corresponding to a thin film transistor in the display panel 110 and placing the second gate electrode GE2, a driving performance of the thin film transistor may be improved while reducing a size of the thin film transistor disposed in the display panel 110.

Furthermore, as the second gate electrode GE2 is implemented by using an electrode layer disposed on an upper layer of the planarization layer PAC, the thin film transistor comprising double gate electrodes may be implemented easily without adding a separate process.

Furthermore, as a portion of the second gate electrode GE2 is disposed on a part area of the planarization layer PAC, the second gate electrode GE2 may provide a function protecting the thin film transistor from electrostatic or the like induced from outside.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection should be construed based on the following claims, and all technical ideas within the scope of equivalents thereof should be construed as being included within the scope of the claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate having thereon an active area where a plurality of subpixels are disposed and a non-active area positioned adjacent to the active area;
   a plurality of thin film transistors disposed on the substrate;
   a planarization layer disposed in at least a portion of the active area and the non-active area on the substrate; and
   a protective layer disposed on the planarization layer;
   wherein at least one of the plurality of thin film transistors including:
      a first gate electrode on the substrate;
      a semiconductor layer on the first gate electrode;
      a source electrode and a drain electrode disposed on the semiconductor layer; and
      a second gate electrode located over the semiconductor layer, the source electrode, and the drain electrode,
   wherein the planarization layer is located in a layer between a layer where the second gate electrode is disposed and a layer where the semiconductor layer is disposed;
   wherein the planarization layer is disposed on at least a portion of an area except for an area where the second gate electrode and a channel region of the semiconductor layer are overlapped with each other, and the planarization layer includes at least one opening area located on an area including the area where the second gate electrode and the channel region of the semiconductor layer are overlapped with each other;
   wherein the second gate electrode is disposed to cover the semiconductor layer, the source electrode, and the drain electrode, and extends along an inclined surface and a top surface of the planarization layer;
   wherein the protective layer is disposed on the at least one opening area, the inclined surface and the top surface of the planarization layer between the second gate electrode and the planarization layer and
   wherein a top surface of the planarization layer and a portion of the second gate electrode are located outside of an area overlapped with the source electrode and the drain electrode.

2. The display device of claim 1, wherein the second gate electrode is electrically connected to the first gate electrode through a contact hole included in the planarization layer in an area except for an area where the semiconductor layer is disposed.

3. The display device of claim 1, wherein the second gate electrode is insulated from the first gate electrode, and the second gate electrode is supplied a same signal as a signal supplied to the first gate electrode.

4. The display device of claim 1, wherein a portion of the second gate electrode is located on the planarization layer.

5. The display device of claim 1, wherein the second gate electrode is located in a same layer as a layer where at least one of a pixel electrode and a common electrode disposed in the subpixel is disposed.

6. The display device of claim 5, wherein the second gate electrode is located in a same layer as an electrode located on an upper layer among the pixel electrode and the common electrode.

7. The display device of claim 5, wherein the second gate electrode is located in a same layer as the pixel electrode, and the common electrode is located on the pixel electrode and is disposed on an entire area of the subpixel.

8. The display device of claim 1, further comprising:
   a first gate insulation layer located between the first gate electrode and the semiconductor layer; and
   a second gate insulation layer located between the semiconductor layer and the second gate electrode, and located under the planarization layer.

9. The display device of claim 8, wherein the planarization layer exposes a part of the second gate insulation layer.

10. The display device of claim 1, wherein the semiconductor layer includes an oxide semiconductor layer.

11. The display device of claim 10, wherein the semiconductor layer includes a first oxide semiconductor layer and a second oxide semiconductor layer disposed on the first oxide semiconductor layer, and wherein a composition ratio of materials included in the first oxide semiconductor layer is different from a composition ratio of materials included in the second oxide semiconductor layer.

12. The display device of claim 11, wherein one of the first oxide semiconductor layer and the second oxide semiconductor layer has indium, gallium and zinc as 1:1:1 of content ratio, and the other has content of gallium higher than content of indium and content of zinc.

13. The display device of claim 1, wherein the thin film transistor including the second gate electrode is disposed on the non-active area, and electrically connected to a gate line disposed on the active area.

14. The display device of claim 1, wherein the thin film transistor including the second gate electrode is disposed on the non-active area, and electrically connected between a link line disposed on the non-active area and a data line disposed on the active area, and
   a first thin film transistor electrically connected to a first data line and a second thin film transistor electrically connected to a second data line are electrically connected to a same link line.

15. The display device of claim 1, wherein the thin film transistor including the second gate electrode is disposed on the active area, and electrically connected to a pixel electrode disposed in the subpixel.

16. A display device, comprising:
   a plurality of first gate lines;
   a plurality of semiconductor layers located on the first gate line and overlapping with a part of the first gate line;
   a planarization layer located on the semiconductor layer, and disposed on an area except for at least a portion of an area where the semiconductor layer is disposed;
   a protective layer disposed on the planarization layer; and
   a plurality of second gate lines located on the semiconductor layer and the planarization layer, and overlapping with at least a part of an area where the first gate line and the semiconductor layer are overlapped with each other,
   wherein the planarization layer includes at least one opening area located on an area including the area where the semiconductor layer is disposed,
   wherein the second gate line is disposed to correspond to the first gate line, and
   wherein the protective layer is disposed on the at least one opening area, an inclined surface and a top surface of the planarization layer between the second gate line and the planarization layer;
   wherein a top surface of the planarization layer and a portion of the second gate electrode are located outside of an area overlapped with the source electrode and the drain electrode.

17. The display device of claim 16, wherein the planarization layer is disposed on an area except for an area where the second gate line and the semiconductor layer are overlapped with each other.

18. The display device of claim 16, wherein the second gate line is spaced apart from the first gate line in an active area.

19. The display device of claim 18, wherein each of the plurality of second gate lines is corresponding to each of the plurality of first gate lines, and electrically connected to the corresponding first gate line in a non-active area.

20. A display device, comprising:
   a substrate;
   a plurality of thin film transistors disposed on the substrate;
   a planarization layer disposed on the thin film transistor;
   a protective layer disposed on the planarization layer;
   at least one opening included in the planarization layer, wherein the at least one opening is located in an area overlapped with the thin film transistor; and
   a plurality of auxiliary electrode patterns disposed in the opening included in the planarization layer, and disposed on a portion of an area on the planarization layer,
   wherein the plurality of auxiliary electrode patterns are disposed to cover the thin film transistor, and extend along an inclined surface and a top surface of the planarization layer, and
   wherein the protective layer is disposed at least one opening area, an inclined surface and a top surface of the planarization layer between the auxiliary electrode pattern and the planarization layer;
   wherein a top surface of the planarization layer and a portion of the second gate electrode are located outside of an area overlapped with the source electrode and the drain electrode.

21. The display device of claim 20, wherein the auxiliary electrode pattern is electrically connected to a gate electrode of the thin film transistor.

22. The display device of claim 20, further comprising at least one insulation layer located between the thin film transistor and the planarization layer, and
   wherein a part of the at least one insulation layer is exposed by the opening of the planarization layer.

23. A display device, comprising:
   a substrate having thereon an active area where a plurality of subpixels are disposed and a non-active area positioned adjacent to the active area;
   a plurality of thin film transistors disposed on the substrate;
   wherein at least one of the plurality of thin film transistors includes:
      a first gate electrode on the substrate;
      a semiconductor layer on the first gate electrode;
      a source electrode and a drain electrode disposed on the semiconductor layer; and
      a second gate electrode located over the semiconductor layer, the source electrode, and the drain electrode;
      a planarization layer that is above and not part of the thin film transistor, the planarization layer disposed in at least a portion of the active area and the non-active area on the substrate;
      a first opening area in the planarization layer located on an area where the second gate electrode and the channel region of the semiconductor layer are overlapped with each other; and
      a second opening area in the planarization layer located in an area spaced from the area where the second gate electrode and the channel region of the semiconductor layer are overlapped with each other;
      wherein the planarization layer is located in a layer between a layer where the second gate electrode is disposed and a layer where the semiconductor layer is disposed;
      wherein the planarization layer is disposed on at least a portion of an area except for an area where the second gate electrode and a channel region of the semiconductor layer are overlapped with each other;
      wherein the second gate electrode is disposed in the first opening to cover the semiconductor layer, the source electrode, and the drain electrode, and extends along an inclined surface, a top surface of the planarization layer and extends further into the second opening area in the planarization layer;

wherein the second gate electrode makes a contact with the first gate electrode in the second opening area in the planarization layer; and wherein a top surface of the planarization layer, a portion of the second gate electrode and the second opening in the planarization layer are located outside of an area overlapped with the source electrode and the drain electrode.

24. The device of claim 23 further including:
a protective layer disposed on the planarization layer and positioned between the planarization layer and the second gate electrode.

25. The device of claim 23 further including:
a protective layer disposed over the planarization layer and on the second gate electrode, the planarization layer being positioned above the second gate electrode.

* * * * *